(12) United States Patent
Keceli et al.

(10) Patent No.: US 11,372,464 B2
(45) Date of Patent: Jun. 28, 2022

(54) ADAPTIVE PARAMETERIZATION FOR MAXIMUM CURRENT PROTECTION

(71) Applicant: Intel Corporation, Santa Clara, CA (US)

(72) Inventors: Fuat Keceli, Hillsboro, OR (US); Frederico Ardanaz, Hillsboro, OR (US); Jonathan M. Eastep, Portland, OR (US); Ankush Varma, Hillsboro, OR (US); Krishnakanth V. Sistla, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 680 days.

(21) Appl. No.: 15/719,481

(22) Filed: Sep. 28, 2017

(65) Prior Publication Data
US 2018/0356868 A1 Dec. 13, 2018

Related U.S. Application Data

(60) Provisional application No. 62/518,419, filed on Jun. 12, 2017.

(51) Int. Cl.
| | |
|---|---|
| *G06F 1/28* | (2006.01) |
| *G06F 1/32* | (2019.01) |
| *G06F 1/26* | (2006.01) |
| *H03K 5/13* | (2014.01) |
| *G06F 1/324* | (2019.01) |
| *G06F 1/3296* | (2019.01) |

(52) U.S. Cl.
CPC ............... *G06F 1/28* (2013.01); *G06F 1/26* (2013.01); *G06F 1/324* (2013.01); *G06F 1/3296* (2013.01); *H03K 5/13* (2013.01)

(58) Field of Classification Search
CPC ..... G06F 1/26; G06F 1/28; G06F 1/324; G06F 1/3296
See application file for complete search history.

(56) References Cited

U.S. PATENT DOCUMENTS

| | | | |
|---|---|---|---|
| 2012/0096248 A1* | 4/2012 | McCarthy | G06F 1/26 713/1 |
| 2013/0064337 A1* | 3/2013 | Hofmann | G06F 1/08 375/354 |
| 2016/0179117 A1 | 6/2016 | Eastep et al. | |
| 2016/0179156 A1 | 6/2016 | Eastep et al. | |
| 2016/0179173 A1 | 6/2016 | Eastep et al. | |
| 2016/0188393 A1 | 6/2016 | Zaman, I et al. | |
| 2017/0192484 A1* | 7/2017 | Priyadarshi | G06F 1/3228 |

* cited by examiner

*Primary Examiner* — Stefan Stoynov
(74) *Attorney, Agent, or Firm* — Schwabe, Williamson & Wyatt, P.C.

(57) ABSTRACT

An apparatus is provided which comprises: a controller to allocate, to a component, a resource budget selected from a plurality of quantization levels; and a circuitry to adaptively update the plurality of quantization levels.

13 Claims, 11 Drawing Sheets

Quantization error

ADAPTIVE PARAMETERIZATION FOR MAXIMUM CURRENT PROTECTION

CLAIM OF PRIORITY

The present application claims priority under 35 U.S.C. § 119(e) to U.S. Provisional Patent Application Ser. No. 62/518,419, filed Jun. 12, 2017 and entitled "ADAPTIVE PARAMETERIZATION FOR MAXIMUM CURRENT PROTECTION," which is herein incorporated by reference in its entirety.

BACKGROUND

One of the electrical constraints on modern computing devices is a limit on a total current delivered to a computing device, e.g., by a motherboard voltage regulator (MBVR). This constraint may become more restrictive in future computing devices, e.g., since with each generation more functionality may be added to System-on-chips (SOCs) due to an increasing transistor count per chip. In turn, more power may have to be delivered by the MBVR. Even though designing for a higher MBVR current capacity may help alleviate this issue, this might increase a cost of the system. Existing computing devices may utilize mechanisms to limit the maximum expected current.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
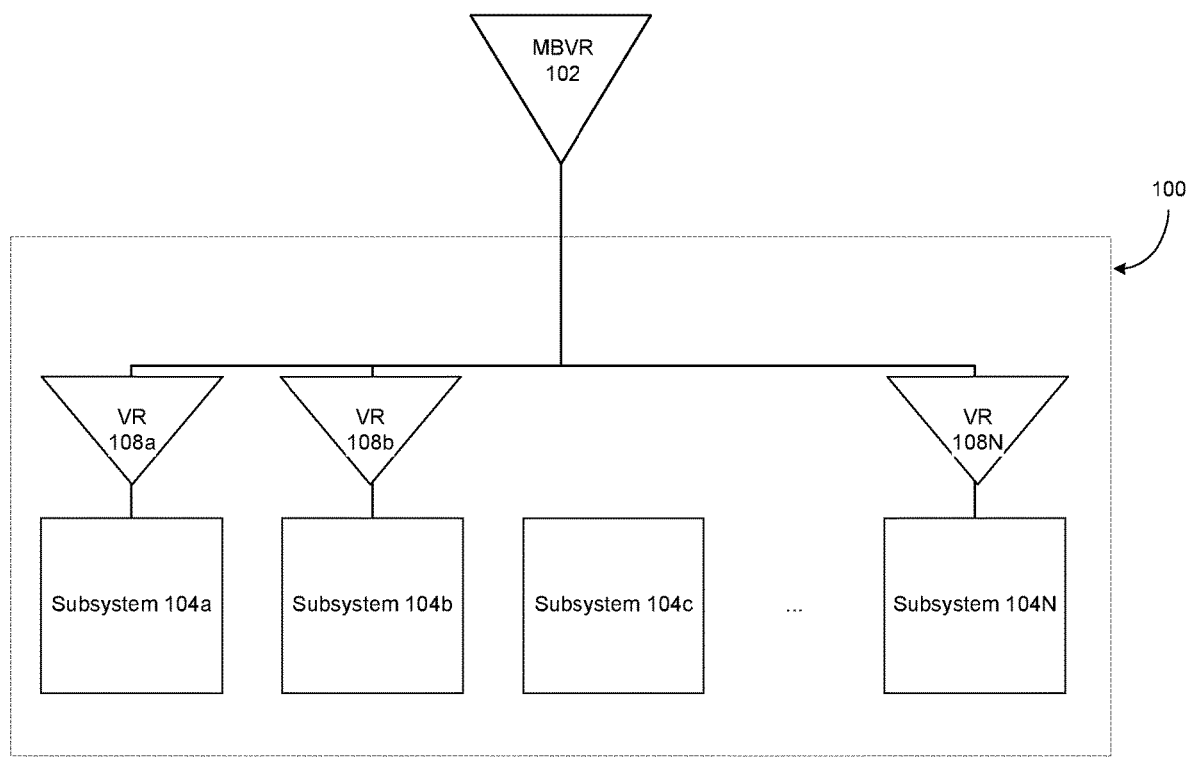
FIG. 1 illustrates a computing system with multiple subsystems, according to some embodiments.

FIG. 1 illustrates a computing system 100 with multiple subsystems 104a, . . . , 104N. Elements referred to herein with a common reference label followed by a particular number or alphabet may be collectively referred to by the reference label alone. For example, subsystems 104a, . . . , 104N may be collectively and generally referred to as subsystems 104 in plural, and subsystem 104 in singular.

Individual subsystems 104 can be, for example, processing cores, processors, memory, arithmetic-logic units, on-chip interconnects, memory controllers, caches, and/or any appropriate component of a computing system. A MBVR 102 may supply power to the subsystems 104a, . . . , 104N. In some embodiments, the MBVR 102 may supply power to the subsystems 104a, . . . , 104N via respective voltage regulators (VR) 108a, . . . , 108N. In some other embodiments, one or more of the VRs 108a, . . . , 108N may be optional, and may not be present in the system 100. Merely as an example, one or more of the VRs 108a, . . . , 108N may be present if, for example, Dynamic Voltage and Frequency Scaling (DVFS) is implemented at the subsystem granularity.

The current consumption of a computing device (e.g. system 100) may be a sum of the currents consumed by all of its subsystems (e.g., subsystems 104). Different workloads may incur different activities on these subsystems, which may affect a total instantaneous current supplied by the MBVR 102. Moreover, the current of a subsystem 104 may be based on (e.g., proportional to) to the corresponding voltage and/or frequency of the subsystem, which may be variable if the subsystem power/performance can be controlled dynamically via mechanisms such as DVFS.

In an example, the total current drawn from the MBVR 102 may be expressed in terms of the currents of individual subsystems 104 as:

$$I_{MBVR} = \Sigma_{k=1}^{n} C_{dyn,k} \cdot f_k \cdot V_k + CONS_k \qquad \text{Equation 1.}$$

In equation 1, the index k may denote a subsystem in a computing device with n subsystems. $C_{dyn,k}$ may be the dynamic capacitance for a $k^{th}$ subsystem, $V_k$ may be the voltage of the $k^{th}$ subsystem, and $f_k$ may be the frequency of the $k^{th}$ subsystem. $CONS_k$ may represent a current drawn by the $k^{th}$ subsystem, e.g., regardless of the activity of the subsystem.

In some embodiments, dynamic capacitance of a subsystem (e.g., dynamic capacitance $C_{dyn,k}$ of a $k^{th}$ subsystem, as discussed with respect to equation 1) may be defined as an equivalent capacitance of the subsystem. In an example, the dynamic capacitance of the subsystem may be a function of the circuit design of the subsystem, the instantaneous activity (e.g., bit switching of the logic gates) of the subsystem, and/or the like. In an example, the dynamic capacitance $C_{dyn,k}$ may depend on the workload that is running on the computing device (e.g., running on the subsystem k).

In an example, in order to reduce the current drawn by a subsystem, the $C_{dyn}$ of a subsystem may be reduced (e.g., using methods such as throttling). In another example, in order to reduce the current drawn by a subsystem, the frequency f and/or voltage V may be reduced, e.g., via DVFS or by another means. In some embodiments, DVFS may be implemented at a system level, e.g., by controlling the frequency and/or the voltage of the MBVR 102. Additionally, or alternatively, DVFS may also be implemented at a subsystem level, e.g., by controlling the frequency and/or the voltage of one or more of the VRs 108a, . . . , 108N.

In an example, reducing current via throttling may be typically less energy and power efficient compared to DVFS. In an example, on the other hand, reducing current via throttling may be faster to execute compared to DVFS.

Various embodiments of this disclosure discuss performing guided current fitting, e.g., to dynamically adjust the power and/or performance point of the subsystems 104, e.g., such that the subsystems 104 may stay within a current budget at a maximum or relatively high performance possible whenever the subsystem dynamic capacitances change. Some embodiments of this disclosure add a layer of dynamic adaptation, which may change how the guided current fitting is performed by the subsystems.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

Figure 2:
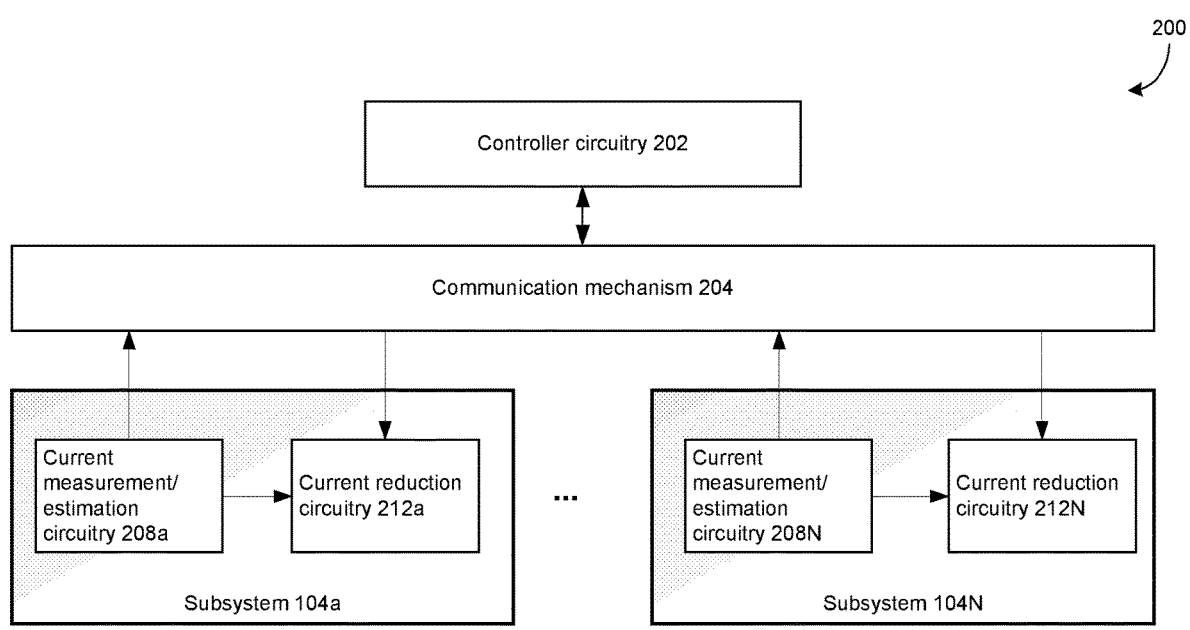
FIG. 2 illustrates a system for controlling instantaneous current of various subsystems (e.g., the subsystems of FIG. 1), to fit available resource budget, according to some embodiments.

FIG. 2 illustrates a system 200 for controlling instantaneous current of various subsystems 104a, . . . , 104N (e.g., the subsystems 104 of FIG. 1), to fit available resource budget, according to some embodiments.

In an example, if there were no physical constraints on the system 200, it would be beneficial to run all the subsystems 104 at a highest or a higher frequency and/or voltage point, e.g., since that may provide the optimal or near optimal performance. However, in most practical systems, a total current supplied by the MBVR 102 of FIG. 1 may be constrained, and hence, the instantaneous current of the system 200 has to fit an available resource budget.

In some embodiments, the system 200 may comprise a controller circuitry 202, which may be able to track the current consumed by each subsystem 104, and may budget available resource per subsystem accordingly. The system 200 may further comprise a communication mechanism 204 (e.g., comprising buses, interconnect links, interconnect fabric, etc.) between the controller circuitry 202 and the subsystems 104.

The system 200 may further comprise, for each subsystem 104, a corresponding current measurement and/or estimation circuitry 208 (e.g., circuitries 208a, . . . 208N), and a corresponding current reduction circuitry 212 (e.g., circuitries 212a, . . . , 212N). A circuitry 208 may measure or estimate the current of a corresponding subsystem 104.

In some embodiments, the communication mechanism 204 may communicate between the circuitry 202 and the circuitries 208a, . . . , 208N, and may also communicate between the circuitry 202 and the circuitries 212a, . . . , 212N.

In an example, the circuitry 208 may be implemented by direct current measurements, e.g., via analog sensors. In another example, a circuitry 208 may be implemented by dynamic capacitance estimations, e.g., via digital methods (which may later be converted to current in some examples). A subsystem 104 may make relatively fast (e.g., but potentially inefficient) local decisions based on this information from the corresponding circuitry 208, and communicate with the controller circuitry 202 for more efficient decisions. In an example, an actual current of a subsystem 104 may not usually exceed a current value measured or estimated by the corresponding circuitry 208.

In an example, the circuitry 212 may externally reduce the current consumption of the corresponding subsystem 104 (e.g., via DVFS), e.g., without altering the workload running on it (e.g., without throttling the workload).

In an example, a guided current fitting action may originate from either locally from a subsystem 104, or from the controller circuitry 202. The local decisions (e.g., made locally by circuitries 208 and/or 212) may be relatively fast, but may be sub-optimal, e.g., since they do not have any information about the budget allocated to other subsystems and/or consumption of the other subsystems. On the other hand, the decisions from the controller circuitry 202 may be relatively slower, e.g., due to communication cost (e.g., delay due to the communication between the subsystems 104 and the circuitry 202) and computation costs (e.g., incurred in the centralized circuitry 202), but the decisions from the controller circuitry 202 may be based on the information collected from all the subsystems 104. The controller may implement an appropriate algorithm, e.g., as long as the sum of the budgets of the subsystems 104 is within the total current envelope of the MBVR 102 of FIG. 1.

Figure 3:
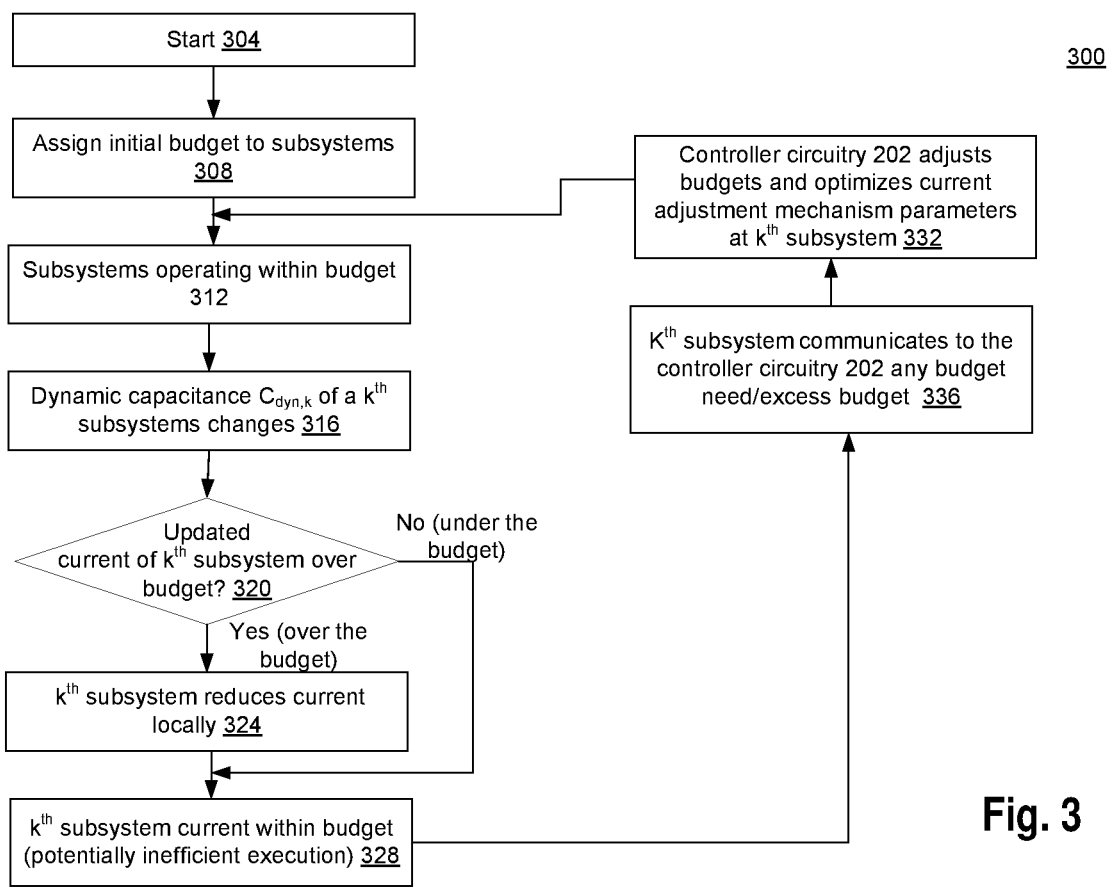
FIG. 3 illustrates a flowchart of a method for operating the system of FIG. 2, according to some embodiments.

FIG. 3 illustrates a high level flowchart of a method 300 for operating the system 200, according to some embodiments. Although the blocks in the flowchart with reference to FIG. 3 are shown in a particular order, the order of the actions can be modified. Thus, the illustrated embodiments can be performed in a different order, and some actions/blocks may be performed in parallel. Some of the blocks and/or operations listed in FIG. 3 may be optional in accordance with certain embodiments. The numbering of the blocks presented is for the sake of clarity and is not intended to prescribe an order of operations in which the various blocks must occur.

At 304, the method 300 may initiate or start. At 308, initial resource budget may be assigned to individual subsystems 104 (e.g., by the controller circuitry 202). Merely as an example, a first subsystem 104a may be assigned a first resource budget (e.g., a current budget), a second subsystem 104b may be assigned a second resource budget, and so on.

At 312, individual subsystems 104 may operating in accordance with the budget. For example, a subsystem 104 may operate at a highest or higher performance possible, given the budget allocated to the subsystem.

At 316, dynamic capacitance $C_{dyn,k}$ of a $k^{th}$ subsystem may change, where the $k^{th}$ subsystem may be one of the subsystems 104a, . . . , 104N. As a result of the change in the dynamic capacitance $C_{dyn,k}$, the current consumption of the $k^{th}$ subsystem may also change accordingly. At 320, a determination is made (e.g., by the circuitry 208 and/or the circuitry 212) as to whether the updated current of the $k^{th}$ subsystem is over the allocated resource budget to the $k^{th}$ subsystem.

If "Yes" at 320 (e.g., if the updated current of the $k^{th}$ subsystem is over the allocated budget), then at 324, the $k^{th}$ subsystem may reduce current locally (e.g., by throttling the current). Subsequent to 324, the method 300 may proceed to 328, where the $k^{th}$ subsystem current may be within the budget (e.g., due to the reduction of current at 324), but may potentially perform inefficient execution (e.g., because the current is throttled, the $k^{th}$ subsystem may not achieve the desired performance).

Also, if "No" at 320 (e.g., if the updated current of the $k^{th}$ subsystem is under the allocated budget), then the method 300 may proceed from 320 to 328.

Subsequent to 328, the method 300 may proceed to 336, where the $k^{th}$ subsystem may communicate to the controller circuitry 202 any budget need or any excess budget (e.g., based on the determination at 320). At 332, the controller circuitry 202 may adjust the budget allocation, and may optimize current adjustment mechanism parameters for the $k^{th}$ subsystem.

In an example, there may be multiple reasons that the execution of the method 300 may be less than optimal, e.g., depending on how the state at 328 is reached and what current reduction mechanisms are used. As an example, throttling may be used as the local current reduction method by the subsystems 104 (e.g., by the circuitries 212) at 324, whereas the controller circuitry 202 may reduce the current via DVFS at 332. This may be a reasonable assumption, e.g., as throttling may react faster than DVFS, and hence may be suitable for reacting to a budget overrun, but throttling may not be as power and energy efficient as DVFS.

For a given subsystem 104 (e.g., subsystem 104a), if the subsystem 104a reaches the state of 328 via the "under the budget" path from 320, the controller circuitry 202 may either shift the excess budget elsewhere (e.g., to other subsystems 104), or may utilize the excess budget within the subsystem 104a by increasing an operating frequency and/or voltage of the subsystem 104a to a point where there is no excess budget for that subsystem 104a. If the subsystem 104a reaches the state of 328 via the "over the budget" path from 320, this may imply that the subsystem 104a is throttling until the controller circuitry 202 may either assign more current to the subsystem 104a, or may reduce its operating frequency and/or voltage to meet the budget.

Figure 4A:
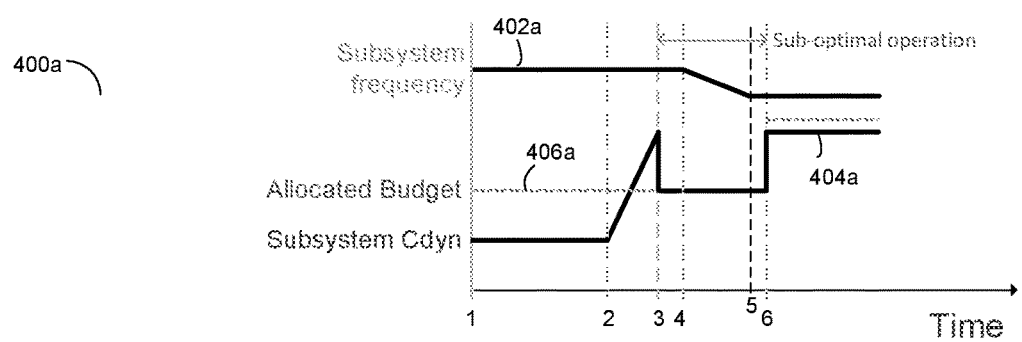
FIGS. 4A-4B illustrate maximum current protection flow for a subsystem with constant current budget, and Dynamic Voltage and Frequency Scaling (DVFS) for guided current fitting by a controller circuitry, according to some embodiments.
Figure 4B:
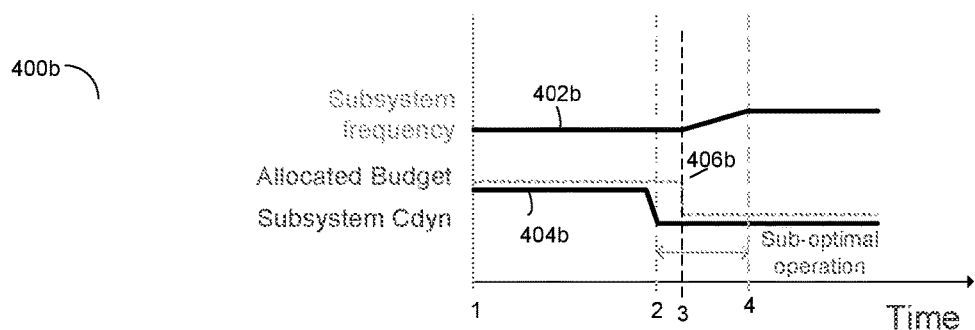

The following FIGS. 4A-4B illustrate the two cases explained above with respect to FIG. 3 (e.g., a first path from 320 to 328 via 324 due to over the budget, and a second path from 320 directly to 328 due to under the budget). DVFS may be used by the controller circuitry 202 to fit the subsystem current to the budget. The subsystem 104 may use dynamic capacitance for current estimates and budgeting.

FIGS. 4A-4B illustrate plots 400a and 400b, respectively, showing maximum current protection flow for a subsystem 104 (e.g., subsystem 104a) with constant current budget, and DVFS for guided current fitting by the controller circuitry 202, according to some embodiments. In FIG. 4A, the $C_{dyn}$ of the subsystem 104a may increase, e.g., due to a change in the workload; and in FIG. 4B, the $C_{dyn}$ of the subsystem 104a may decrease, e.g., due to a change in the workload.

In both FIGS. 4A-4B, the X axis represents time. The Y axis represents subsystem frequency, as well as the $C_{dyn}$ of the subsystem 104a. For example, the lines 402a and 402b of FIGS. 4A and 4B, respectively, illustrate the frequency of the subsystem 104a. The lines 404a and 404b of FIGS. 4A and 4B, respectively, illustrate the $C_{dyn}$ of the subsystem 104a. Dotted lines 406a and 406b of FIGS. 4A and 4B, respectively, illustrate allocated $C_{dyn}$ budget to the subsystem 104a.

The sequence of events in FIG. 4a may be as follows. Initially, the subsystem 104a may be under the allocated dynamic capacitance budget (e.g., between points 1 and 2). Subsystem $C_{dyn}$ may start increasing due to the workload running on the computing device, and the Cdyn of the subsystem 104a may surpass the allocated budget (e.g., line 404a crossing over and becoming higher than the line 406a sometime between points 2 and 3). As a result, the subsystem may 104a throttle to bring the $C_{dyn}$ down to the budget after a short detection/reaction delay (short excursions may be tolerable by the MBVR), as illustrated by the sharp decline in $C_{dyn}$ at point 3 in the figure. At point 4, the controller circuitry 202 may start reducing the subsystem frequency in order to increase the $C_{dyn}$ budget of the subsystem 104a—note that even though the current budget may be fixed in this example, the $C_{dyn}$ budget may be increased by reducing the voltage and/or the frequency point (see Equation 1). At point 5, the controller circuitry 202 may set a new budget, e.g., once the voltage and/or the frequency point is reduced. At point 6, once the $C_{dyn}$ budget is adjusted, the subsystem 104a may release the previous throttling, e.g., following a signal from the controller circuitry 202 indicating the new budget. As a result, from point 6, the $C_{dyn}$ may experience a sharp increase.

The sequence of events in FIG. 4b may be as follows. Initially, the subsystem 104a may be under the allocated dynamic capacitance budget (e.g., between points 1 and 2).

The subsystem Glyn may start decreasing (e.g., starting at about or immediately prior to the point 2), e.g., due to the workload running on the computing device, thereby creating a gap between the allocated current budget and the actual current consumption. In an example, the subsystem 104a may communicate with the controller 202 for a lower budget. At point 3, the controller 202 may lower the budget, and, for example, the controller 202 may start increasing the subsystem frequency from point 3, e.g., in order to bring the subsystem 104a to a higher performance point while reducing the allocated $C_{dyn}$ budget (e.g., the current budget may still be constant). At point 4, the controller 202 may communicate the new budget to the subsystem 104a.

In FIGS. 4A and 4B, periods of possible non-optimal or sub-optimal operations are illustrated using respective arrows.

An ideal maximum current protection system may be able to track the electrical current observation with no delay and converge to an optimal or near optimal solution instantaneously. In reality, a delay may exist between the observation and the controller circuitry 202 adjusting the subsystems according to a solution. This delay may be due to the internal communication and/or computation costs, and on average may be expressed with the following equation.

$$D = CONST + F(\#events).\qquad\text{Equation 2.}$$

The first term in this equation, CONST, may be a constant that may depend on the SoC design, or other fixed parameters. F may be a monotonically increasing function of the number of times that controller circuitry 202 receives current change reports from the subsystems 104 (e.g., to which the controller circuitry may react via current guiding actions). A larger delay may imply that the maximum current protection system is not able to react to the changes in the subsystems fast enough, and the subsystems 104 may remain at the inefficient execution states for relatively longer time duration.

Figure 5:
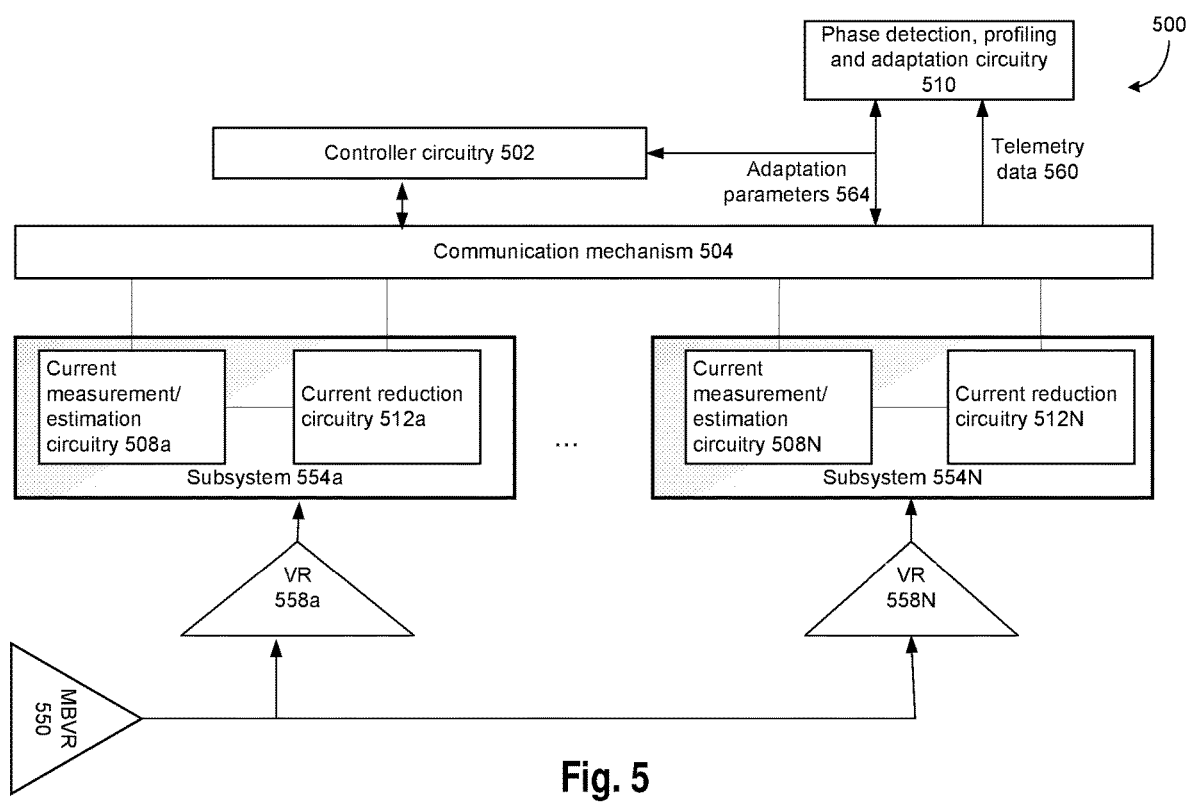
FIG. 5 illustrates a computing system for adaptively controlling instantaneous current of various subsystems to fit an available budget, e.g., by adaptively updating one or more hysteresis parameters and/or the quantization level parameters, according to some embodiments.

FIG. 5 illustrates a computing system 500 for adaptively controlling instantaneous current of various subsystems 554a, . . . , 554N to fit an available budget, e.g., by adaptively updating one or more hysteresis parameters and/or the quantization level parameters, according to some embodiments. Various components of FIG. 5 (e.g., 502, 504, 508a, . . . , 508N, 512a, . . . , 512N, 550, 554a, . . . , 554N, 558a, . . . , 558N) may be evident from corresponding components of FIGS. 1 and 2 (e.g., 202, 204, 208a, . . . , 208N, 212a, . . . , 212N, 102, 104a, . . . , 104N, 108a, . . . , 108N, respectively), and hence, these components will not be discussed herein in details. Various discussion associated with FIGS. 1-4 may be applicable to the system 500.

In some embodiments, the system 500 may further comprise a phase detection, profiling and adaptation circuitry 510. The circuitry 510 may receive telemetry data 560, e.g., from various subsystems 554. In some embodiments, the circuitry 510 may generate adaptation parameters 564, and may transmit the parameters 564 to the subsystems 554 and/or to the controller circuitry 502, as discussed herein in details. In some embodiments, the circuitry 510 can be implemented externally (e.g., via a combination of hardware and/or software), and/or in a dedicated microcontroller (e.g., in the form of firmware).

Figure 6:
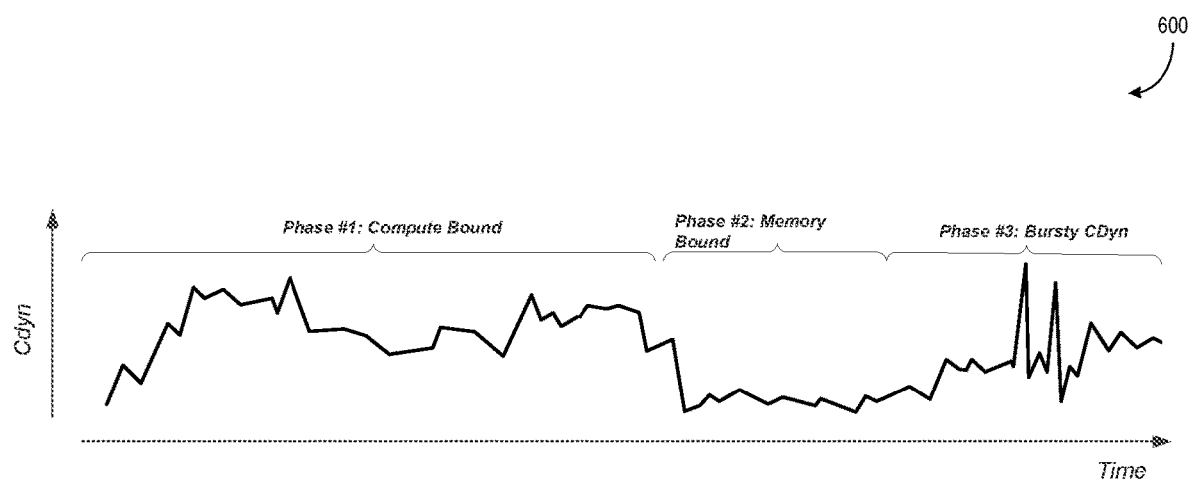
FIG. 6 illustrates various example phases of operation of an example subsystem of the system of FIG. 5, according to some embodiments.

In some embodiments, while in operation, the system 500 may undergo through various phases of operation. FIG. 6 illustrates various example phases of operation of an example subsystem 554 (e.g., subsystem 554a) of the system 500, according to some embodiments. FIG. 6 is a graph of $C_{dyn}$ (Y axis) versus time (X axis). Merely as an example, phase 1 may be a compute bound phase, during which the subsystem 554a (which may be, merely as an example, a processor) may have relatively high and somewhat steady $C_{dyn}$. During phase 1, the subsystem 554a may be engaged in active computation, e.g., may execute instructions and not waiting for data from a cache, a memory, etc.

During a phase 2, the subsystem 554a may wait for data to be fetched from a cache, a memory, etc. For example, the subsystem 554a may be stalled, and may have low and somewhat steady $C_{dyn}$. In some embodiments, during the phase 2, the subsystem 554a may wait for data (e.g., be stalled) multiple times. For example, during phase 2, although the subsystem 554a may perform some computation, the subsystem 554a may wait during a substantial portion of the phase 2 for data to be fetched from caches, one or more memory, etc.

During phase 3, the $C_{dyn}$ of the subsystem 554a may be bursty (e.g., rapidly changing with time) and/or may be unpredictable to some extent.

In some embodiments, the graph 600 of FIG. 6 may be generated by measuring current consumption of a subsystem 554 (e.g., subsystem 554a), by monitoring logic gate activities of the subsystem 554a, and/or the like.

In some embodiments, an example mechanism that may detect the phases of a program or a subsystem may include an Application Programming Interface (API) which the application can use to explicitly mark phases. Knowledge of the phases can be communicated (e.g., to the circuitry 510) via this API.

In some embodiments, automatic phase detection (APD) may also be used to detect the phase. For example, APD can be applied to deduce the phases of a program, e.g., from the telemetry data 560 collected from a computing device. An example of an APD has been discussed in further details in U.S. patent Publication No. US20160188393, entitled "Automatic phase detection."

In some embodiments, based on one or more of these example mechanisms (e.g., using API to detect phase, using APD to detect phase, and/or using another appropriate mechanism to detect phase), a system that recognizes and adapts to the current phase may be constructed. For example, one or both these mechanisms can be used (e.g., by circuitry 510) to detect or estimate an upcoming phase and/or to estimate an ongoing phase of a subsystem. For example, the phases of a subsystem may be repetitive in nature (e.g., occurs frequently), and so, the circuitry 510 may estimate a current phase or an upcoming phase of a subsystem.

Referring again to FIG. 5, an input to the circuitry 510 may be the telemetry data 560 collected from the subsystems 554 and/or from other components of the system 500. In some embodiments, based on this telemetry data 560, the circuitry 510 (e.g., a phase detection and profiling part of the circuitry 510) may deduce the characteristics of the workload execution phase. In some embodiments, the circuitry 510 (e.g., an adaption part of the circuitry 510) may use this phase information and/or previously collected data about the phase to make a decision for the control parameter values during this phase. For example, the circuitry 510 may adaptively generate adaptation parameters 564, based at least in part on the current phase information and/or previously collected data about the current phase. In some embodiments, such mechanism may implement a feedback-guided control system employing an optimization method (e.g., such as gradient descent) to gradually converge to the optimal set of values. Examples of such mechanism are discussed in further details in U.S. Patent Publication No.

US20160179117A1, entitled "Systems and methods for dynamic temporal power steering"; in U.S. Patent Publication No. US20160179173A1, entitled "Systems and methods for dynamic spatial power steering"; and in U.S. Patent Publication No. US20160179156A1, entitled "Hybrid power management approach." In some embodiments, the adaptation parameters may be communicated to the controller circuitry 502, to the subsystems 554, and/or to other components of the system 500.

In some embodiments, in the system 500, the per-subsystem $C_{dyn}$ budget (or current budget) may be quantized into a finite number of levels (e.g., because the computations are done in the digital domain). In some embodiments, a lower number of such quantization levels may reduce the communication and computation costs (e.g., as discussed herein above at least in part with respect to equation 2), but may result in increased computational error. Each level may be expressed in terms of a higher and a lower threshold value, where the unit of the value may depend on the current measurement/estimation circuitries 508. In some embodiments, the budget quantization levels may be decided adaptively, e.g., by the circuitry 510. For example, the adaptation parameters 564 may include the adaptively determined budget quantization levels for a subsystem. Such adaptive determination of the budget quantization levels for a subsystem (e.g., the subsystem 554a) may be based on an estimated phase of the subsystem 554a (e.g., where the phase may be estimated by the circuitry 510).

Instead of adaptively determining the budget quantization levels, the budget quantization levels may be static. However, such static budget quantization levels may typically lead to underutilization of the total current budget due to quantization errors. In order to not exceed the MBVR current constraint, subsystem current and/or Cdyn observations may be rounded up to the next quantization level. In order to alleviate the quantization errors, the quantization resolution can be increased. However, such an increase may lead to higher communication and computation costs for the maximum current protection system (e.g., see equation 2). In turn, subsystems 554 may receive optimal or near optimal solutions with relatively larger delays, remaining at the inefficient execution states longer. This phenomenon may particularly affect workloads which cause rapid Cdyn and/or current changes on the subsystems.

However, in some embodiments, adaptively updating the budget quantization levels may alleviate these issues, as discussed in details herein later. For example, some of the embodiments discussed herein is associated with adaptively changing threshold values of the fixed number of quantization levels, e.g., to more closely track the current consumption of the subsystems and hence, reducing the losses that arise from the quantization errors. If the quantization level thresholds are adjusted dynamically on a per workload basis via a controller algorithm that has the global view of the system 500 (e.g., of the subsystems 554), the maximum current protection system can operate at an optimal or near optimal state, e.g., where it can track the current measurements and/or estimates fast enough, without creating a communication or computation bottleneck.

A mechanism that may aim to reduce the communication and computation costs is decision hysteresis. Decision hysteresis may introduce a concept of a no-reaction period, e.g., during which the reactions to the subsystem Glyn changes may be put on hold temporarily, thereby effectively limiting the number of current guiding actions (e.g., number of events "#events") of equation 2. There can be a number of criteria that triggers a decision hysteresis, one of which may be high-to-low hysteresis. In an example, high-to-low hysteresis may trigger a no-reaction period to stop budget reduction actions towards a subsystem, once the budget has been increased. In some embodiments, a high-to-low hysteresis may be of interest, for example, because keeping the budget at a higher point may avoid potentially higher number of throttling events, which may not be efficient.

Figure 7:
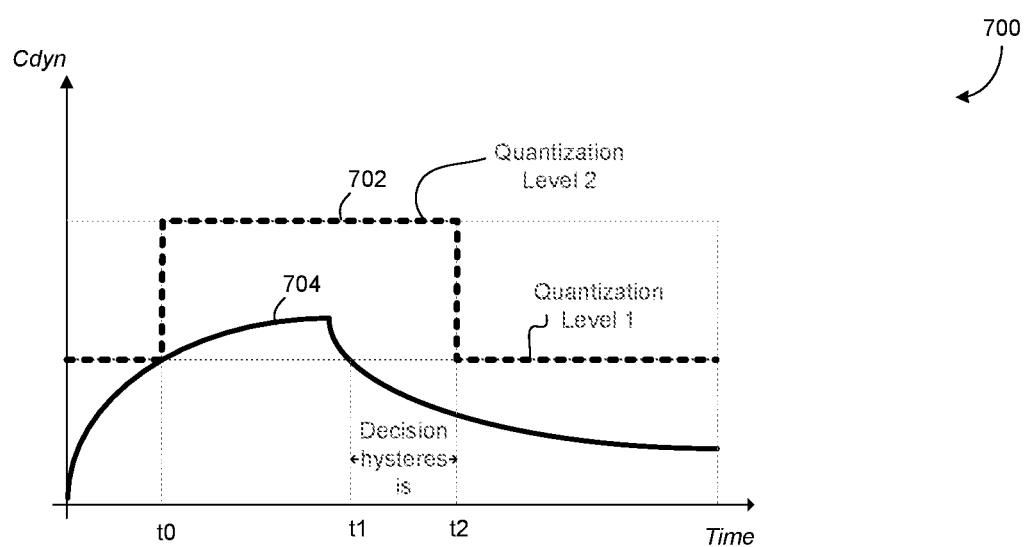
FIG. 7 illustrates a graph depicting hysteresis delay in switching between budget quantization levels for a subsystem of FIG. 5, according to some embodiments.

FIG. 7 illustrates a graph 700 depicting hysteresis delay in switching between budget quantization levels for a subsystem 554 of FIG. 5, according to some embodiments. The X axis represents time, and the Y axis illustrates $C_{dyn}$. The graph 700 illustrates, using solid line 704, the actual $C_{dyn}$; and budgeted or allocated $C_{dyn}$ using dotted line 702.

Prior to time t0, the estimated $C_{dyn}$ of the subsystem may be less than a threshold, where the threshold may correspond to the allocated or budgeted $C_{dyn}$ for the subsystem. For example, prior to time t0, the budgeted $C_{dyn}$ may be at a quantization level 1.

At time t0, the estimated $C_{dyn}$ exceeds the allocated or budgeted $C_{dyn}$, and hence, the budgeted $C_{dyn}$ may be increased to quantization level 2 from time t0, as illustrated by the line 702.

Subsequently, at time t1, the estimated $C_{dyn}$ may decrease and go below the $C_{dyn}$ associated with the quantization level 1, and remain below the $C_{dyn}$ associated with the quantization level 1. However, due to the hysteresis delay, the budgeted $C_{dyn}$ may not be decreased immediately from time t1—rather, the budgeted $C_{dyn}$ may be decreased from time t2. The delay between t1 and t2 may be due to the decision hysteresis delay.

However, deferring decisions associated with hysteresis may have the similar effect of subsystems remaining at the inefficient execution states. For example, shorter hysteresis may result in rapid state change and increased computing, whereas longer hysteresis may result in the subsystem remaining at an inefficient execution state for a longer period.

In some embodiments, a hysteresis parameter may dictate the amount of hysteresis delay. As will be discussed herein, in some embodiments, the circuitry 510 may adaptively update the hysteresis parameter for a subsystem 554 (or for the system 500), e.g., based on estimating a phase of operation of the subsystem 554 (or phase of operation of the system 500) or based on another appropriate factor.

In some embodiments, the hysteresis delay may be applied when the resource budget is to be decreased, and may not be applied when the resource budget is to be increased. For example, any delay in increasing the resource budget may adversely impact the performance of the corresponding subsystem, and hence, hysteresis may not be applied when the budget is to be increased, as illustrated in FIG. 7. As discussed, the hysteresis delay applied (e.g., when the resource budget is to be decreased) may be adaptively updated, based on the estimated current and/or upcoming operational phase of a subsystem.

Thus, as discussed herein, various embodiments of this disclosure may adaptively and dynamically set the parameters related to maximum current protection (such as the quantization level thresholds and/or the decision hysteresis delay), e.g., on a per-workload or per-phase basis.

In some embodiments, in the example of adaptive budget quantization, the adaptation mechanism (e.g., in the circuitry 510) may execute one or both of the following two actions to influence the computing device performance: (i) Change the threshold values in a way that the number of quantization levels is the same, but levels are spaced out differently to better track the current profile—this is demonstrated in FIGS. 8A and 8B. (ii) Change the threshold values in a way that the number of quantization levels is effectively changed (e.g., reduced) to change (e.g., lower) the computation and communication bottlenecks in the maximum current protection system—this applies to workloads with rapidly or widely changing current profiles, as demonstrated in FIGS. 9A-9B.

Figure 8A:
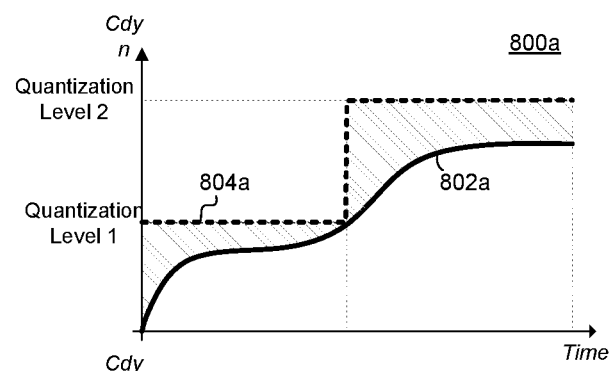
FIGS. 8A and 8B illustrate two graphs showing effects of adaptively setting the quantization levels for a subsystem of FIG. 5, according to some embodiments.
Figure 8B:
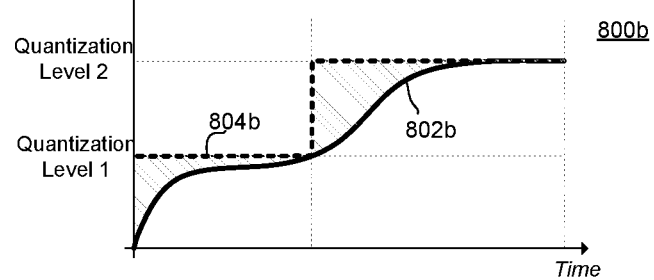

FIGS. 8A and 8B illustrate graphs 800a and 800b, respectively, illustrating effects of adaptively setting the quantization levels for a subsystem 554 of FIG. 5, according to some embodiments. The X axis of graphs 800a and 800b represent time, and the Y axis illustrates $C_{dyn}$. The graph 800a and 800b illustrate, using solid line 802a and 802b, respectively, the actual $C_{dyn}$ in two scenarios. The graph 800a and 800b illustrate, using dotted lines 804a and 804b, respectively, the budgeted $C_{dyn}$ with two possible quantization levels. Thus, FIGS. 8A-8B are directed to adapting to the current profile of a workload, and with two quantization levels assumed. The shaded regions illustrate quantization gaps or quantization errors. In FIG. 8A, due to the way the quantization levels are set, the quantization errors are relatively large. In some embodiments and as illustrate in FIG. 8B, the quantization levels may be set adaptively so that the quantization errors are relatively smaller.

Figure 9A:
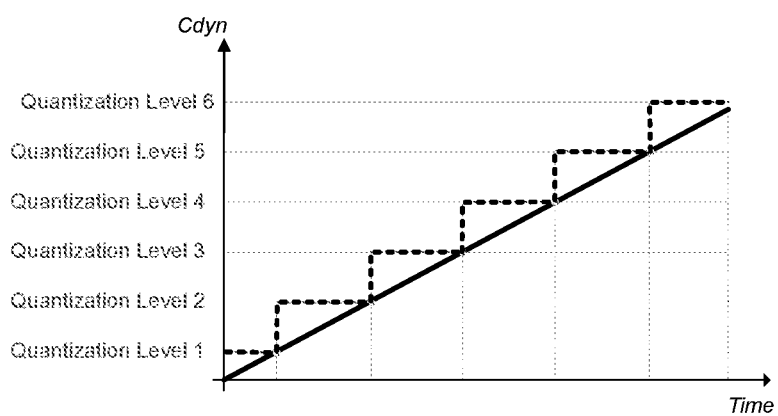
FIGS. 9A and 9B illustrate two plots showing adaptively changing a number of quantization levels used for allocating resource budget to various subsystems of FIG. 5, according to some embodiments.
Figure 9B:
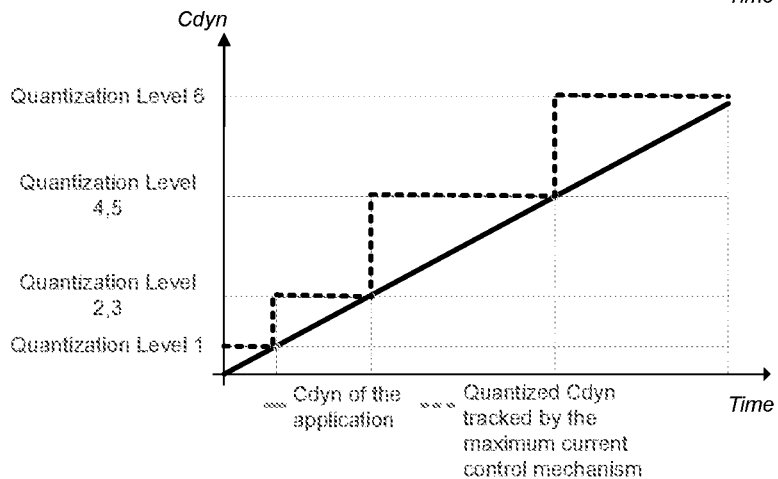

FIGS. 9A and 9B illustrate plots showing adaptively changing a number of quantization levels used for allocating resource budget to various subsystems of FIG. 5, according to some embodiments. For example, in these figures, the solid line illustrates the actual load, and the dotted line illustrates the change in the quantization level of the budgeted $C_{dyn}$. In FIG. 9A, there are 6 quantization levels, while in FIG. 9B there are 4 quantization levels. With the decrease in the quantization level, the computational load may decrease, but the quantization error may increase.

Figure 10:
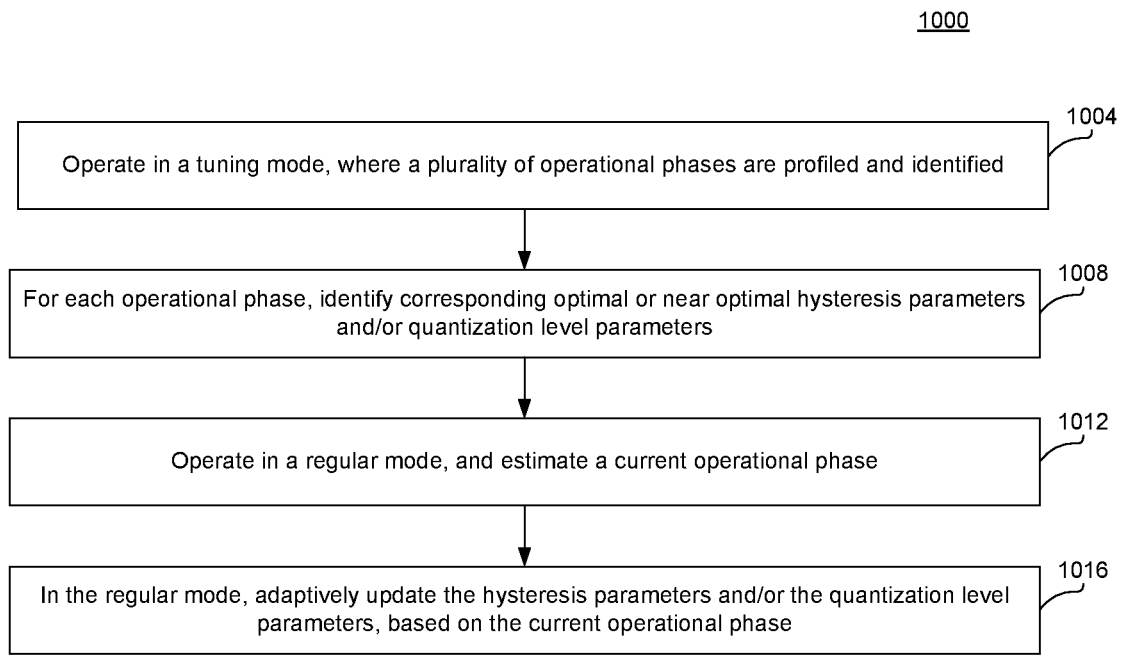
FIG. 10 illustrates a flowchart depicting a method for adaptively updating hysteresis parameters and/or quantization level parameters, based on a current operational phase of a subsystem of FIG. 5, according to some embodiments.

FIG. 10 illustrates a flowchart depicting a method 1000 for adaptively updating hysteresis parameters and/or quantization level parameters, based on a current operational phase of a subsystem of FIG. 5, according to some embodiments. Although the blocks in the flowchart with reference to FIG. 10 are shown in a particular order, the order of the actions can be modified. Thus, the illustrated embodiments can be performed in a different order, and some actions/blocks may be performed in parallel. Some of the blocks and/or operations listed in FIG. 10 may be optional in accordance with certain embodiments. The numbering of the blocks presented is for the sake of clarity and is not intended to prescribe an order of operations in which the various blocks must occur.

In some embodiments, at 1004, a system (e.g., system 500) may be operated in a tuning mode (e.g., which may also be referred to as a calibration phase), where a plurality of operational phases of the system and/or of individual subsystems 554 may be profiled and identified, as discussed herein above.

At 1008, for each operational phase, corresponding optimal or near optimal hysteresis parameters and/or quantization level parameters may be identified or established. Such identification may be based on an appropriate optimization method (e.g., such as gradient descent) to gradually converge to the optimal or near optimal set of values.

At 1012, the system 500 and/or individual subsystems 554 may be operated in a regular mode, and a current operational phase of the system 500 and/or individual subsystems 554 may be estimated.

At 1016, in the regular mode, the hysteresis parameters and/or the quantization level parameters may be adaptively updated, based on the current operational phase (e.g., to correspond to the optimal or near optimal hysteresis parameters and/or quantization level parameters identified at 1008 for the current operational phase).

Various embodiments of this disclosure discuss adaptively or dynamically (e.g., in real-time, automatically, without user intervention, etc.) updating various parameters associated with maximum current protection mechanism (e.g., to ensure that the maximum current of the whole system does not exceed the total available budget). Examples of such parameters discussed herein include quantization parameters, hysteresis parameters, etc. However, in some embodiments, various other parameters associated with maximum current protection mechanism may also be adaptively updated, e.g., based on estimating a current operation phase of the system. Thus, updating the quantization parameters and/or hysteresis parameters are merely examples, and any parameter associated with maximum current protection mechanism may also be adaptively updated, e.g., based on estimating a current operation phase of the system.

Figure 11:
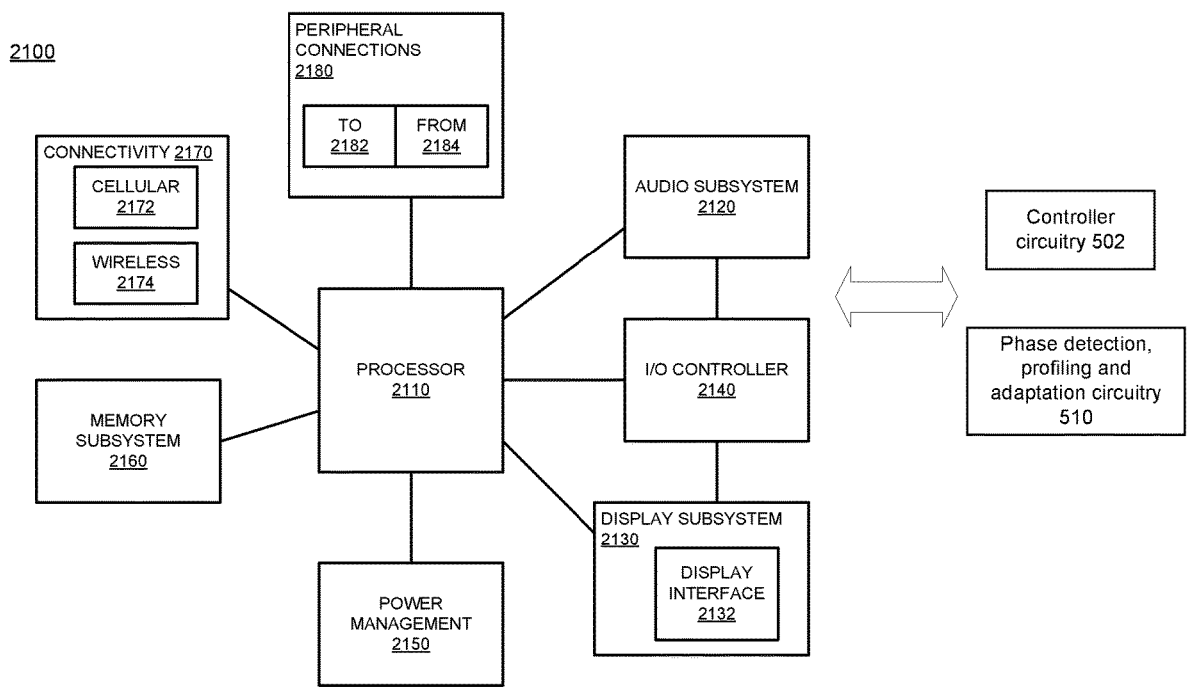
FIG. 11 illustrates a computer system, computing device or a SoC, where hysteresis parameters and/or the quantization level parameters for allocating resource to individual subsystems may be adaptively and dynamically updated, according to some embodiments.

FIG. 11 illustrates a computer system, computing device or a SoC (System-on-Chip) 2100, where hysteresis parameters and/or the quantization level parameters for allocating resource to individual subsystems may be adaptively and dynamically updated, according to some embodiments. It is pointed out that those elements of FIG. 11 having the same reference numbers (or names) as the elements of any other figure can operate or function in any manner similar to that described, but are not limited to such.

In some embodiments, computing device 2100 represents an appropriate computing device, such as a computing tablet, a server, a workstation, a mobile phone or smartphone, a laptop, a desktop, an IOT device, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 may comprise the controller circuitry 502, the phase detection, profiling and adaptation circuitry 510, and/or various components discussed with respect to FIG. 5 (or other figures herein earlier). In an example, individual subsystems 554a, . . . , 554N discussed with respect to FIG. 5 may be any appropriate component of the computing device 2100 (e.g., the processor 2110). In some embodiments, the circuitries 502, 510 and/or the like may adaptively and dynamically update various parameters of the computing device 2100 associated with a maximum current in a system, as discussed herein in this disclosure, e.g., with respect to FIGS. 1-10. One or more of the circuitries 502, 510 may be implemented in any of the components of the computing device 2100, e.g., in the processor 2110, appropriate hardware circuitry or microprocessor of the computing device 2100 (not illustrated in FIG. 11), and/or the like.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following example clauses pertain to further embodiments. Specifics in the example clauses may be used anywhere in one or more embodiments. All optional features of the apparatus described herein may also be implemented with respect to a method or process.

Example 1. An apparatus comprising: a controller to allocate, to a component, a resource budget selected from a plurality of quantization levels; and a circuitry to adaptively update the plurality of quantization levels.

Example 2. The apparatus of example 1 or any other example, wherein the circuitry is a first circuitry, and wherein the apparatus comprises: a second circuitry to estimate an operational phase of the component, wherein the first circuitry is to adaptively update the plurality of quantization levels, based on the estimated operational phase of the component.

Example 3. The apparatus of example 1 or any other example, wherein to adaptively update the plurality of quantization levels, the circuitry is to adaptively update a number of quantization levels in the plurality of quantization levels.

Example 4. The apparatus of example 1 or any other example, wherein to adaptively update the plurality of quantization levels, the circuitry is to adaptively update values of individual quantization levels in the plurality of quantization levels.

Example 5. The apparatus of any of examples 1-4 or any other example, wherein the component is to operate in accordance with the allocated resource budget.

Example 6. The apparatus of example 5 or any other example, wherein the component is to: apply throttling to reduce a current consumed by the component, in response to the component exceeding the allocated resource budget.

Example 7. The apparatus of example 6 or any other example, wherein the resource budget is a first resource budget, and wherein the controller is to: allocate, to the component, a second resource budget selected from the plurality of quantization levels, in response to the component exceeding the allocated resource budget and subsequent to the component applying the throttling.

Example 8. The apparatus of any of examples 1-4 or any other example, wherein: the controller is to apply a hysteresis in allocating the resource budget; and the circuitry is to adaptively update a hysteresis parameter associated with the hysteresis.

Example 9. A system comprising: a memory to store instructions; a processor coupled to the memory, the processor to execute the instructions; a first circuitry to use a plurality of quantization levels to quantize an available budget for allocation to the processor; and a second circuitry to dynamically set the plurality of quantization levels.

Example 10. The system of example 9 or any other example, further comprising: a third circuitry to estimate a current and/or an upcoming operational phase of the processor, wherein the second circuitry is to dynamically set the plurality of quantization levels, based on the current and/or the upcoming operational phase of the processor.

Example 11. The system of any of examples 9-10 or any other example, wherein: the first circuitry is to apply a hysteresis delay in allocating a resource budget to the processor; and the second circuitry is to dynamically set the hysteresis delay.

Example 12. The system of any of examples 9-10 or any other example, wherein to dynamically set the plurality of quantization levels, the second circuitry is to dynamically set a number of quantization levels in the plurality of quantization levels.

Example 13. The system of any of examples 9-10 or any other example, wherein to dynamically set the plurality of quantization levels, the second circuitry is to dynamically set values of individual quantization levels in the plurality of quantization levels.

Example 14. An apparatus comprising: a controller to apply a hysteresis delay in allocating, to a component, a resource budget; and a circuitry to adaptively update the hysteresis delay, based on an operational phase of the component.

Example 15. The apparatus of example 14 or any other example, wherein the circuitry is a first circuitry, the wherein the apparatus comprises: a second circuitry to estimate the operational phase of the component.

Example 16. The apparatus of any of examples 14-15 or any other example, wherein: the controller is to apply the hysteresis delay when the controller is to decrease an allocation of the resource budget to the component.

Example 17. The apparatus of any of examples 14-15 or any other example, wherein: the controller is to refrain from applying the hysteresis delay when the controller is to increase the allocation of the resource budget to the component.

Example 18. An apparatus comprising: a first circuitry to identify a first quantization parameter and a second quantization parameter corresponding to a first operation phase and a second operation phase, respectively, of a component; a second circuitry to identify that the component is operating in the first operation phase; a third circuitry to set a plurality of quantization levels based on the first quantization parameter, in response to the identification that the component is operating in the first operation phase; and a fourth circuitry to allocate, to the component, a resource budget selected from the plurality of quantization levels.

Example 19. The apparatus of example 18 or any other example, wherein the first circuitry is to identify the first quantization parameter and the second quantization parameter corresponding to the first operation phase and the second operation phase, respectively, based on a feedback-guided control system employing a gradient descent optimization method.

Example 20. The apparatus of any of examples 18-19 or any other example, wherein to set the plurality of quantization levels, the third circuitry is to set one or both of: a number of quantization levels in the plurality of quantization levels, or values of individual quantization levels in the plurality of quantization levels.

Example 21. A method comprising: allocating, to a component, a resource budget selected from a plurality of quantization levels; applying a hysteresis in allocating the resource budget; and adaptively updating one or both of: the plurality of quantization levels, or a hysteresis parameter associated with the hysteresis.

Example 22. The method of example 21 or any other example, wherein the adaptively updating comprises: estimating an operational phase of the component; and adaptively updating, based on the estimated operational phase of the component.

Example 23. The method of any of examples 21-22 or any other example, wherein adaptively updating the plurality of quantization levels comprises one or both of: adaptively updating a number of quantization levels in the plurality of quantization levels, or adaptively updating values of individual quantization levels in the plurality of quantization levels.

Example 24. One or more non-transitory computer-readable storage media to store instructions that, when executed by a processor, cause the processor to execute a method of any of the examples 21-23.

Example 25. An apparatus comprising: means for performing the method of any of the examples 21-23.

Example 26. An apparatus comprising: means for allocating, to a component, a resource budget selected from a plurality of quantization levels; means for applying a hysteresis in allocating the resource budget; and means for adaptively updating one or both of: the plurality of quantization levels, or a hysteresis parameter associated with the hysteresis.

Example 27. The apparatus of example 26 or any other example, wherein the means for adaptively updating comprises: means for estimating an operational phase of the component; and means for adaptively updating, based on the estimated operational phase of the component.

Example 28. The apparatus of any of examples 26-27 or any other example, wherein the means for adaptively updating the plurality of quantization levels comprises one or both of: means for adaptively updating a number of quantization levels in the plurality of quantization levels, or means for adaptively updating values of individual quantization levels in the plurality of quantization levels.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
 a controller to allocate, to a component, a first resource budget selected from a plurality of quantization levels; and
 a circuitry to adaptively update the plurality of quantization levels, wherein the controller is to allocate, to the component, a second resource budget selected from the plurality of quantization levels, in response to the component exceeding the first resource budget and subsequent to application of throttle by the component.

2. The apparatus of claim 1, wherein the circuitry is a first circuitry, and wherein the apparatus comprises:
 a second circuitry to estimate an operational phase of the component,
 wherein the first circuitry is to adaptively update the plurality of quantization levels, based on the estimated operational phase of the component.

3. The apparatus of claim 1, wherein to adaptively update the plurality of quantization levels, the circuitry is to adaptively update a number of quantization levels in the plurality of quantization levels.

4. The apparatus of claim 1, wherein to adaptively update the plurality of quantization levels, the circuitry is to adaptively update values of individual quantization levels in the plurality of quantization levels.

5. The apparatus of claim 1, wherein the component is to operate in accordance with the first resource budget.

6. The apparatus of claim 5, wherein the component is to:
 apply throttling to reduce a current consumed by the component, in response to the component exceeding the first resource budget.

7. A system comprising:
 a memory to store instructions;
 a processor coupled to the memory, the processor to execute the instructions;
 a first circuitry to use a plurality of quantization levels to quantize an available budget for allocation to the processor; and
 a second circuitry to dynamically set the plurality of quantization levels; and
 a third circuitry to estimate a current and/or a future operational phase of the processor, wherein the second circuitry is to dynamically set the plurality of quantization levels, based on a quantization parameter associated with the future operational phase of the processor; and
 a fourth circuitry to allocate, to the component, a resource budget selected from the plurality of quantization levels.

8. The system of claim 7, wherein the second circuitry is to dynamically set the plurality of quantization levels, further based on the current operational phase of the processor.

9. The system of claim 7, wherein to dynamically set the plurality of quantization levels, the second circuitry is to dynamically set a number of quantization levels in the plurality of quantization levels.

10. The system of claim 7, wherein to dynamically set the plurality of quantization levels, the second circuitry is to dynamically set values of individual quantization levels in the plurality of quantization levels.

11. An apparatus comprising:
   a first circuitry to identify a first quantization parameter and a second quantization parameter corresponding to a first operation phase and a second operation phase, respectively, of a component;
   a second circuitry to identify that the component is operating in the first operation phase;
   a third circuitry to set a plurality of quantization levels based on the first quantization parameter, in response to the identification that the component is operating in the first operation phase; and
   a fourth circuitry to allocate, to the component, a resource budget selected from the plurality of quantization levels.

12. The apparatus of claim 11, wherein the first circuitry is to identify the first quantization parameter and the second quantization parameter corresponding to the first operation phase and the second operation phase, respectively, based on a feedback-guided control system employing a gradient descent optimization method.

13. The apparatus of claim 11, wherein to set the plurality of quantization levels, the third circuitry is to set one or both of: a number of quantization levels in the plurality of quantization levels, or values of individual quantization levels in the plurality of quantization levels.

* * * * *